(12) United States Patent
Wang

(10) Patent No.: US 7,048,181 B2
(45) Date of Patent: May 23, 2006

(54) PORTABLE DEVICE WITH A STORAGE BOX CONTAINING A DATA ACCESS DEVICE

(75) Inventor: Chia-Jen Wang, Taipei Hsien (TW)

(73) Assignee: Datastor Technology Co., Ltd., Taipei Hsien (TW)

( * ) Notice: Subject to any disclaimer, the term of this patent is extended or adjusted under 35 U.S.C. 154(b) by 4 days.

(21) Appl. No.: 10/905,270

(22) Filed: Dec. 23, 2004

(65) Prior Publication Data

US 2006/0071073 A1 Apr. 6, 2006

(30) Foreign Application Priority Data

Oct. 1, 2004 (TW) ............................. 93129892 A

(51) Int. Cl.
*G06K 5/00* (2006.01)

(52) U.S. Cl. ...................... 235/380; 235/487; 235/435

(58) Field of Classification Search ................ 206/320, 206/307, 701, 45, 312.2; 190/102; 235/380, 235/487, 492, 493, 435
See application file for complete search history.

(56) References Cited

U.S. PATENT DOCUMENTS

| | | | | |
|---|---|---|---|---|
| 1,666,001 A | * | 4/1928 | Catala ........................ 206/754 |
| 3,765,528 A | * | 10/1973 | Parisot ....................... 206/754 |
| 4,732,269 A | * | 3/1988 | Roy ........................... 206/751 |
| 5,096,055 A | * | 3/1992 | Opper ........................ 206/754 |
| 5,212,628 A | * | 5/1993 | Bradbury .................... 361/683 |
| 5,214,574 A | * | 5/1993 | Chang ........................ 361/680 |
| 5,226,540 A | * | 7/1993 | Bradbury .................... 206/576 |
| 5,379,893 A | * | 1/1995 | Ruiz .......................... 206/320 |
| 5,485,922 A | * | 1/1996 | Butcher ...................... 206/576 |
| 5,529,174 A | * | 6/1996 | McQueeny .................. 206/749 |
| 5,590,022 A | * | 12/1996 | Harvey ....................... 361/683 |
| 5,666,265 A | * | 9/1997 | Lutz et al. ................... 361/683 |
| 5,684,672 A | * | 11/1997 | Karidis et al. ............... 361/683 |
| 5,719,744 A | * | 2/1998 | Jenkins et al. .............. 361/683 |
| 5,808,865 A | * | 9/1998 | Alves ......................... 361/685 |
| 5,992,155 A | * | 11/1999 | Kobayashi et al. ........... 62/3.7 |
| 6,006,915 A | * | 12/1999 | Moor ......................... 206/579 |
| 6,105,763 A | * | 8/2000 | Saetia ........................ 206/320 |
| 6,138,826 A | * | 10/2000 | Kanamori et al. ........ 206/316.2 |
| 6,145,661 A | * | 11/2000 | Jung .......................... 206/320 |
| 6,304,459 B1 | * | 10/2001 | Toyosato et al. ............ 361/681 |
| 6,351,388 B1 | * | 2/2002 | Jenkins et al. .............. 361/730 |
| 6,417,761 B1 | * | 7/2002 | Elliott ..................... 340/309.7 |
| 6,438,685 B1 | * | 8/2002 | Brower et al. ................ 713/1 |
| 6,501,643 B1 | * | 12/2002 | Sayers et al. ............... 361/683 |
| 6,564,998 B1 | * | 5/2003 | Oross et al. ................ 235/382 |
| 6,592,031 B1 | * | 7/2003 | Klatt ......................... 235/382 |
| 6,688,521 B1 | * | 2/2004 | Cheng ........................ 235/451 |
| 6,697,264 B1 | * | 2/2004 | Ikeura ........................ 361/826 |
| 6,705,529 B1 | * | 3/2004 | Kettunen et al. ........... 235/486 |
| 6,776,345 B1 | * | 8/2004 | Liang ......................... 235/486 |
| 2002/0034113 A1 | * | 3/2002 | Fujii et al. ................... 365/202 |
| 2002/0157978 A1 | * | 10/2002 | Roundy ...................... 206/361 |
| 2003/0075604 A1 | * | 4/2003 | Fuji et al. ................... 235/451 |
| 2003/0178486 A1 | * | 9/2003 | Teng et al. .................. 235/441 |
| 2004/0016805 A1 | * | 1/2004 | Li ............................... 235/439 |
| 2004/0089571 A1 | * | 5/2004 | Lin ............................ 206/320 |

\* cited by examiner

*Primary Examiner*—Daniel Walsh
(74) *Attorney, Agent, or Firm*—Winston Hsu

(57) ABSTRACT

A card reader having a memory card inserted can be disposed inside a storage box. A cover and a base of the storage box include an opening when the storage box is closed. This structure allows a transmission line connected to the card reader to stretch out of the storage box through the opening when the cover of the box is closed.

13 Claims, 11 Drawing Sheets

PORTABLE DEVICE WITH A STORAGE BOX CONTAINING A DATA ACCESS DEVICE

BACKGROUND OF INVENTION

1. Field of the Invention

The present invention relates to a memory card reader, and more specifically, to a memory card reader with a storage box.

2. Description of the Prior Art

With the popularity of digital cameras, palm-sized digital devices such as personal digital assistants (PDAs), and MP3 players, various kinds of small storage devices are becoming available. Generally it is flash cards that prevail among the area of small storage devices. Some widely known and used small storage device cards are COMPACT FLASH (CF), XD-PICTURE, SECURE DIGITAL (SD), MULTIMEDI-ACARD (MMC), REDUCED MMC, SMARTMEDIA (SM), MEMORY STICK (including MAGIC GATE, MEMORY STICK PRO and DUO), and MINI SD.

Since the variety and capacity of flash cards is growing continuously, the need to transmit data between different types of memory cards is of great concern. Therefore, accessing data by connecting a memory card to a computer with a serial port interface or with one single universal serial bus (USB) transmission line is no longer suitable.

A flash card reader solves the above problem. With a flash card reader, data on various types of memory cards can be exchanged, without use of a digital camera or PDA, greatly promoting the interchangeability of data. Many kinds of card readers are available, each with its specialty. Some features employed include supporting a plurality of kinds or volumes of memory cards, having different types of transmission interfaces, and combination with other computer peripherals such as a computer mouse, a monitor, or a 5.25-inch/3.5-inch mobile rack installed on the computer case. Nevertheless, the connectors to a memory card in these card readers are all designed as an exposed socket in order to reduce the size of the card reader and to allow easy insertion/ejection of the memory card.

Please refer to FIG. 1. FIG. 1 is an illustration of a prior art card reader device 10. The card reader device 10 comprises a card reader 12, a plurality of sockets 14, and a transmission line 16. The plurality of sockets 14 are each designed for different types of memory cards 191, 192. In order to prevent the socket 14 of the card reader device 10 from dust or dirt contamination that can affect performance, a removable dust cover 18 is installed on the socket 14.

However, such design leads to a potential risk: the connector of the card reader 12 can be contaminated faster if the dust cover 18 gets lost. Moreover, when a memory card 191, 192 is plugged into the socket 14, part of the memory card 191, 192 is still exposed outside the card reader 12, making it vulnerable to any unexpected external force. Taiwan Patent No. 566,627 "Improvement of a Card Reader Structure" teaches a dust protection mechanism having a supporting rack arranged around a card reader. Since the supporting rack is connected to the shell of the card reader, the supporting rack is not easily lost. While this patent solves the above-mentioned dust prevention problem of a generic card reader, a memory card in use is still unsafe since part of the memory card is exposed outside the card reader.

SUMMARY OF INVENTION

Therefore, the primary objective of the present invention is to provide a portable device with a storage box containing a data access device.

The present invention provides a portable device having a storage box for containing a data access device comprising: a data access device for accessing data; and a storage box for containing the data access device, the storage box comprising a cover and a base wherein when the cover of the box is closed an opening exists allowing a transmission line connected to the data access device to stretch out of the box.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
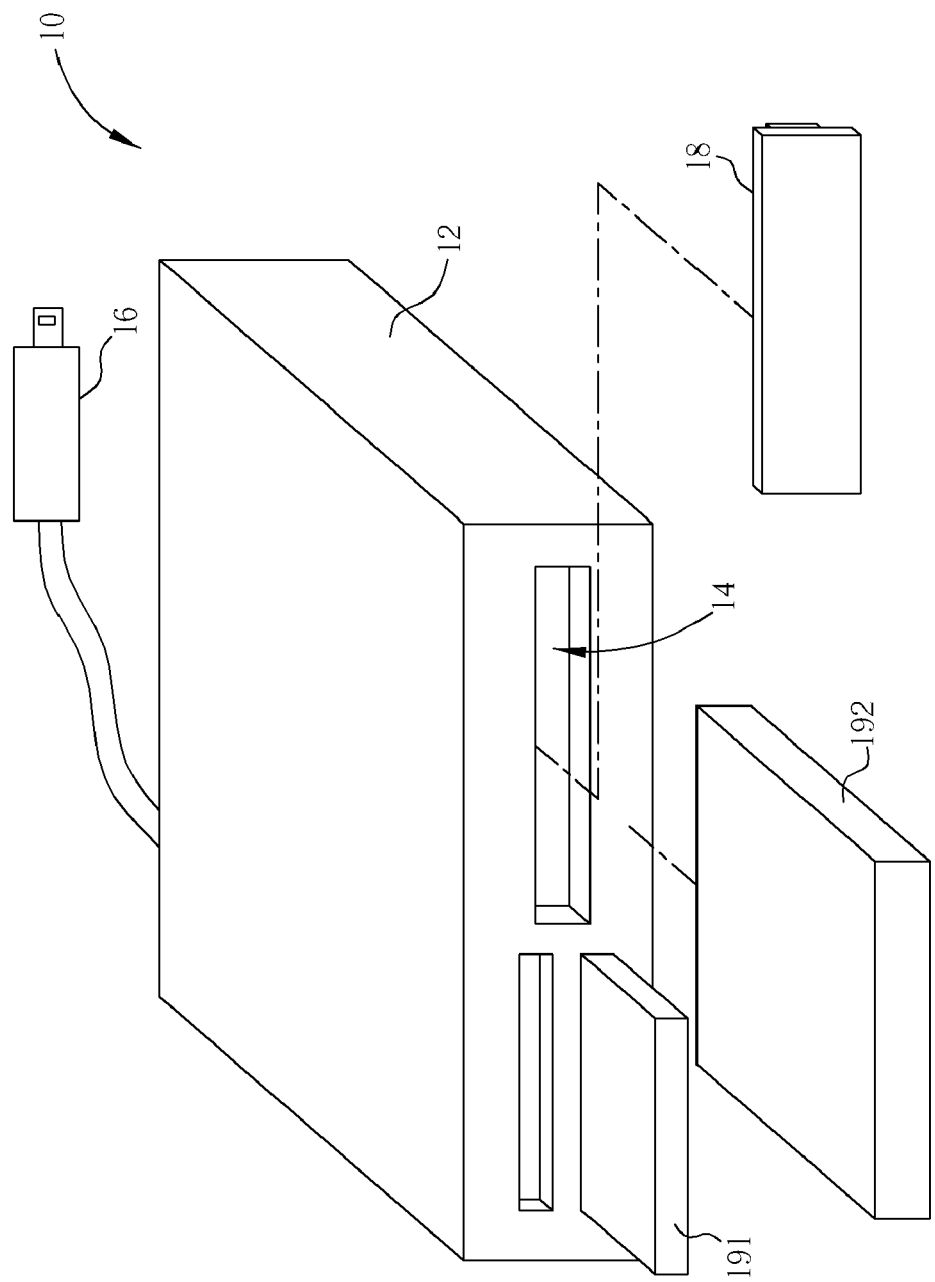
FIG. 1 is a schematic diagram of a prior art card reader device.
Figure 2:
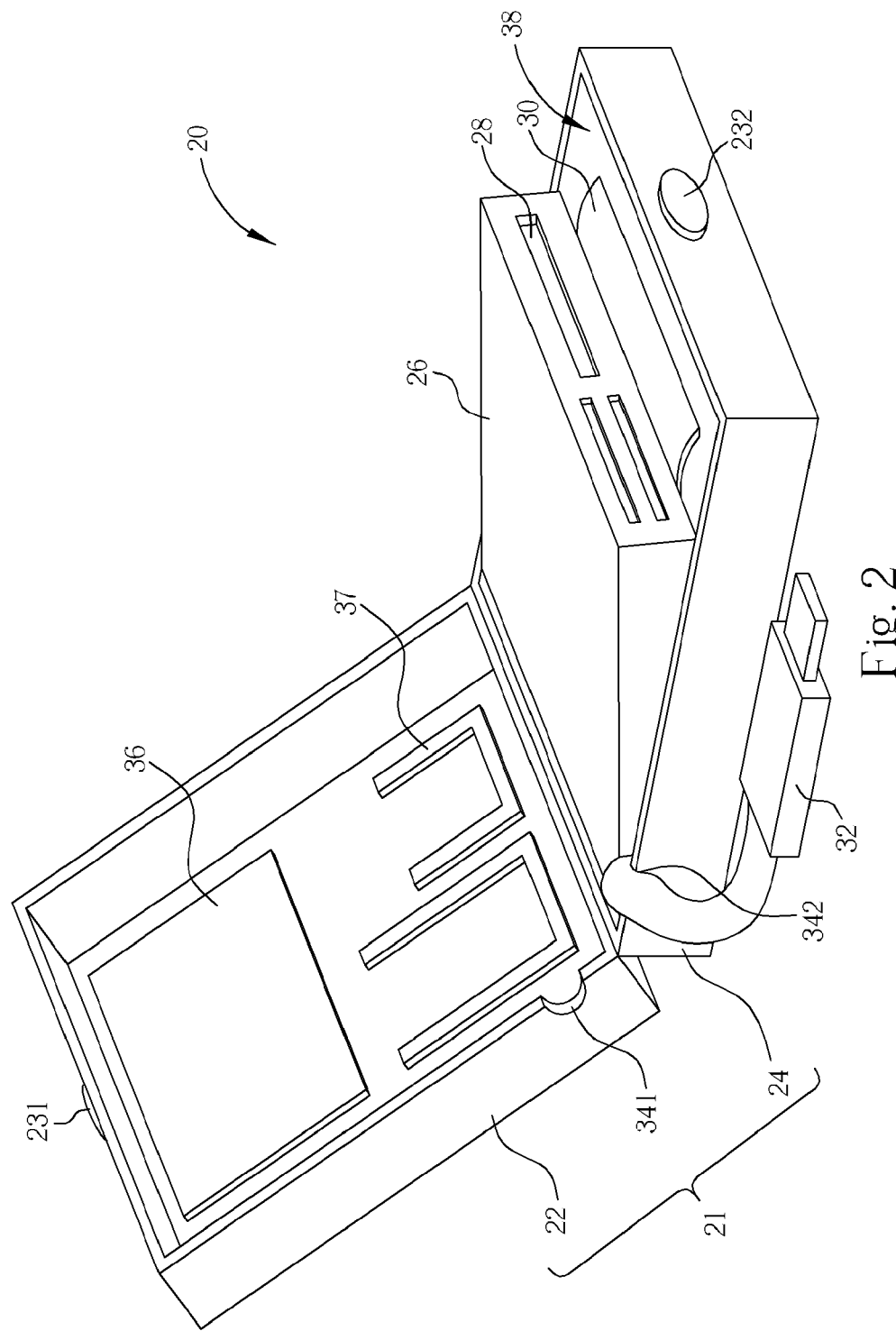
FIG. 2 is a schematic diagram of the present invention portable device with a storage box.
Figure 3:
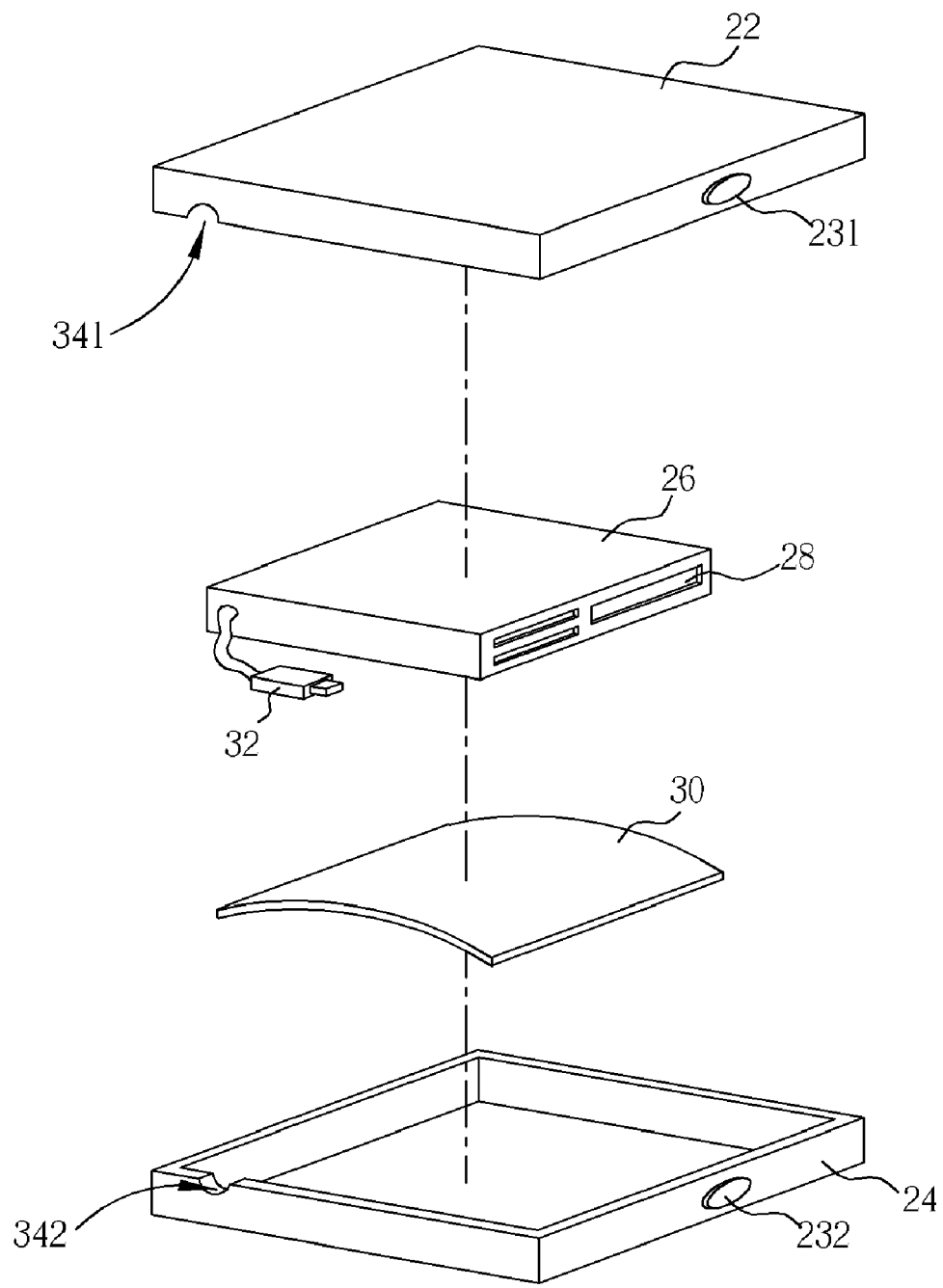
FIG. 3 is an exploded view of the portable device of FIG. 2.

Please refer to FIG. 2 and FIG. 3. FIG. 2 illustrates the present invention portable device 20. FIG. 3 is an exploded view of the portable device of FIG. 2. The portable device 20 comprises a storage box 21 composed of a cover 22 and a base 24, a card reader 26, an elastic body 30, and a transmission line 32. The cover 22 and the base 24 of the storage box 21 have notches 341, 342 respectively to form an opening 34 as the cover 22 is closed onto the base 24, allowing the transmission line 32 to stretch out of the storage box 21. A hook 231 and a fastener 232 are disposed respectively on the front end of the cover 22 and the front end of the base 24 to lock the cover 22 and the base 24 when the storage box 21 is closed. A plurality of sockets 28 are disposed on the front end of the card reader 26, allowing insertion of a plurality types of memory cards. In addition, a mirror 36 and a card-holding slot 37 are disposed inside the cover 22 of the storage box 21.

The card reader 26 is disposed inside the storage box 21 where the back end of the card reader 26 is removably connected to the base 24 of the storage box 21. Therefore, the card reader 26 is capable of being disposed directly inside the storage box 21 for complete protection, as well as being removed from the storage box 21.

To be more convenient in receiving a memory card into the card reader 26, an elastic body 30, e.g. a spring, is further disposed on the base 24 of the storage box 21. One end of the elastic body 30 is connected to the card reader 26 and the other end of the elastic body 30 is connected to the base 24, allowing the front end of the card reader 26 to elastically spring away from the base 24 as the cover 22 is lifted, i.e., when the hook 231 is no longer locked to the fastener 232. The elastic body 30 allows the front end of the card reader 26 to rise up to a height that allows insertion of a memory card into the socket 28. When closing the storage box 21, the cover 22 presses down on the card reader 26 (with or without a memory card plugged into the socket 28) together with the elastic body 30 until the hook 231 of the cover 22 is locked to the fastener 232 of base 24.

In addition, the back end of the cover 22 is rotatably connected (i.e. hinged) to the back end of the base 24. When the hook 231 and the fastener 232 are locked, the cover 22 and the base 24 are closed to provide protection to the card reader 26. As the cover 22 opens, the cover 22 is capable of rotating to any angle about the axis of the back end of the cover 22. Inside the cover 22, the card-holding slot 37 allows storage of unused memory cards.

Figure 4:
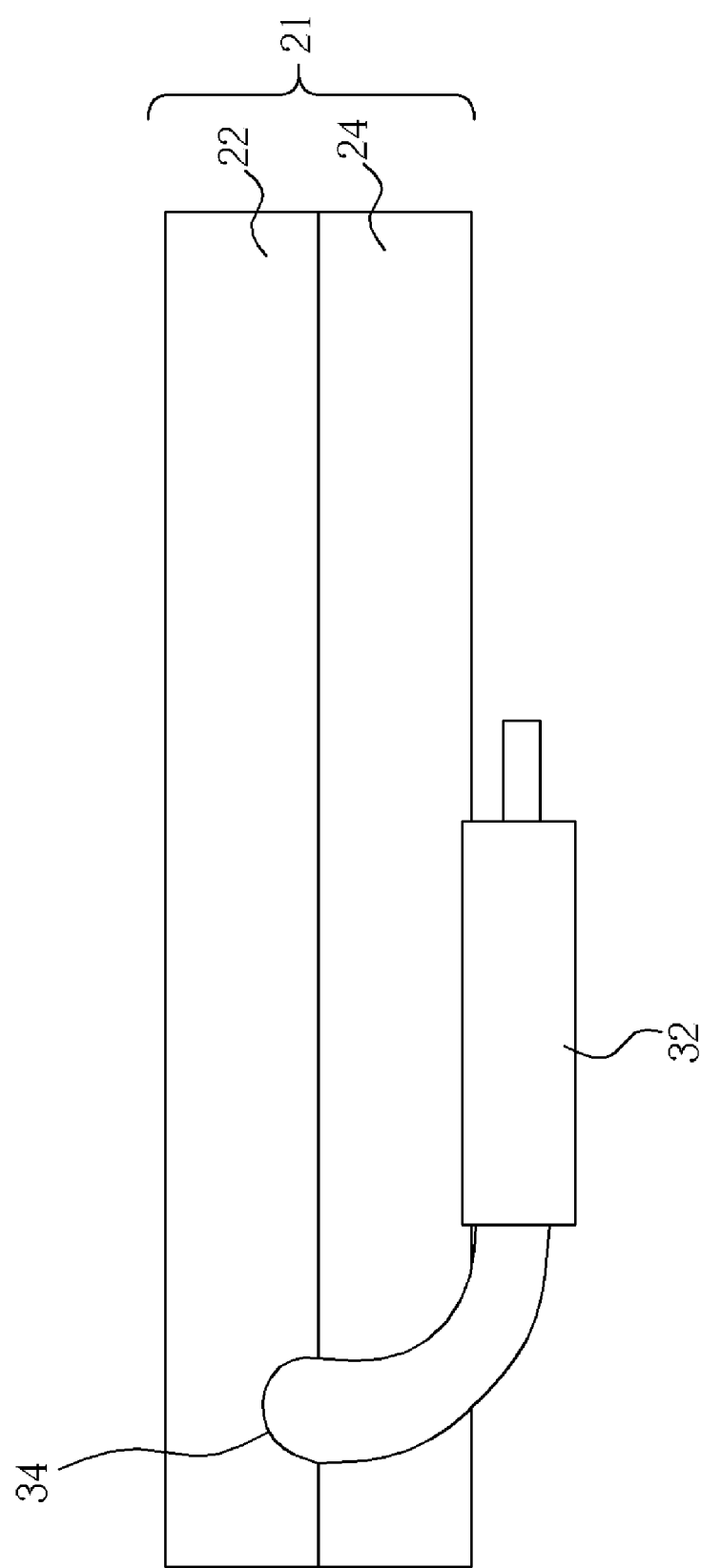
FIG. 4 is a left view of the portable device of FIG. 2.

Please refer to FIG. 4. FIG. 4 is a left view of the present invention portable device. As FIG. 4 shows, the opening 34 exists when the cover 24 is closed to the base 24 of the storage box 21. The opening 34 allows for the transmission line 32, which is connected to the card reader 26, to stretch out of the storage box 21. The transmission line 32 is removably connected to the card reader 26 and generally is a universal serial bus (USB), FIREWIRE, or other type of interface.

Figure 5:
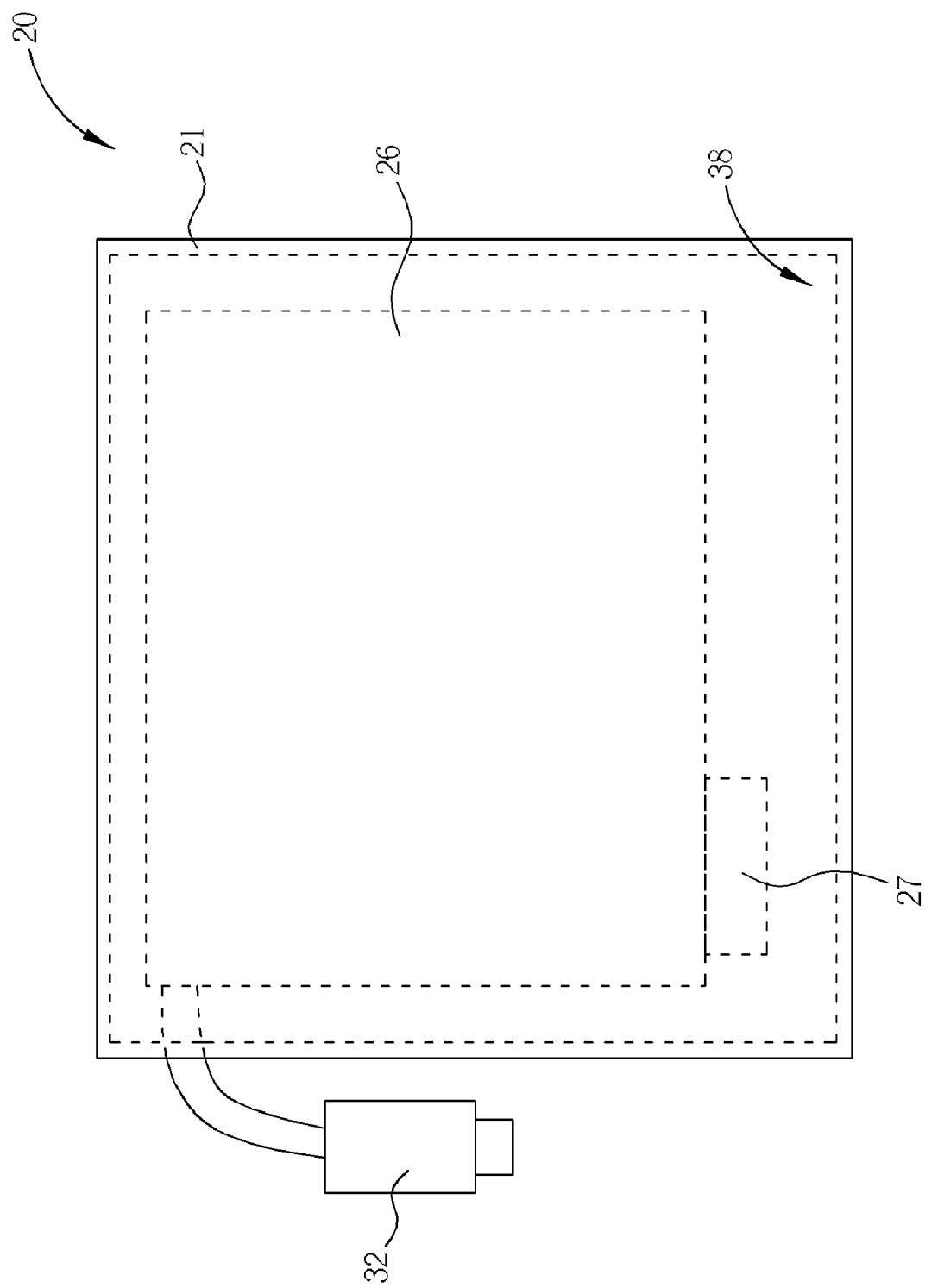
FIG. 5 is a top view of the present invention when a memory card is plugged into a socket of a card reader in a storage box.

Please refer to FIG. 5. FIG. 5 is a perspective view of the present invention storage device 20 when a memory card 27 is plugged into the card reader 26 in the storage box 21. A distance between the front end of the storage box 21 and the front end of the card reader 26 forms a card area 38 which is longer than a length of the exposed part of the memory card 26 when the memory card 26 is plugged into the socket 28 of the card reader 26. Therefore, the card reader 26 and the plugged-in memory card 27 are fully contained in the storage box 21 when the memory card 27 is plugged into the card reader 26. Even when a memory card 27 is in use, the remaining sockets 28 of the card reader 26 are still protected, and the memory card 27 has no risk of being inadvertently removed from the card reader 26 or of being damaged. These advantages are not provided in any prior art.

Figure 6:
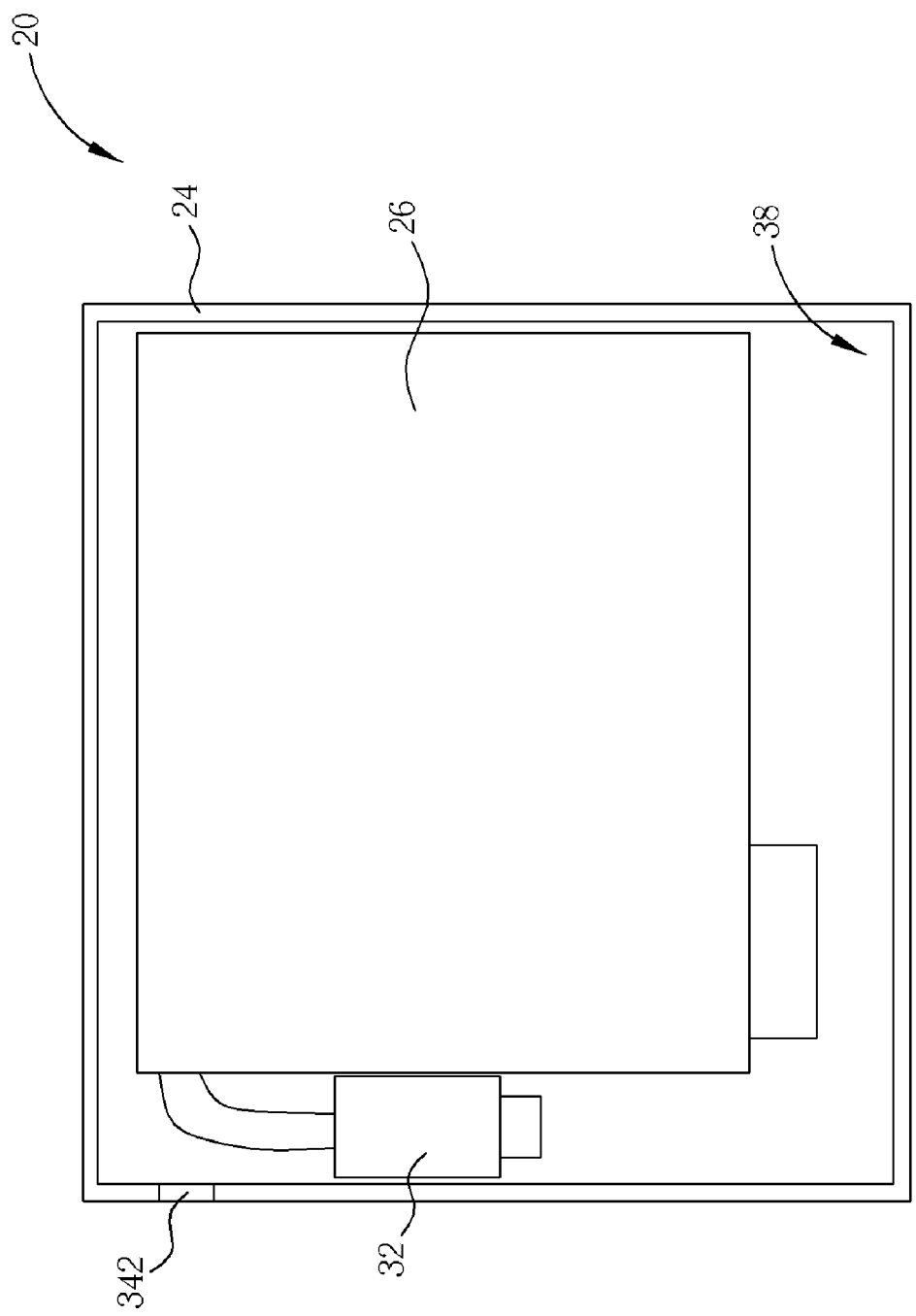
FIG. 6 illustrates an exemplary embodiment of the present invention portable device.
Figure 7:
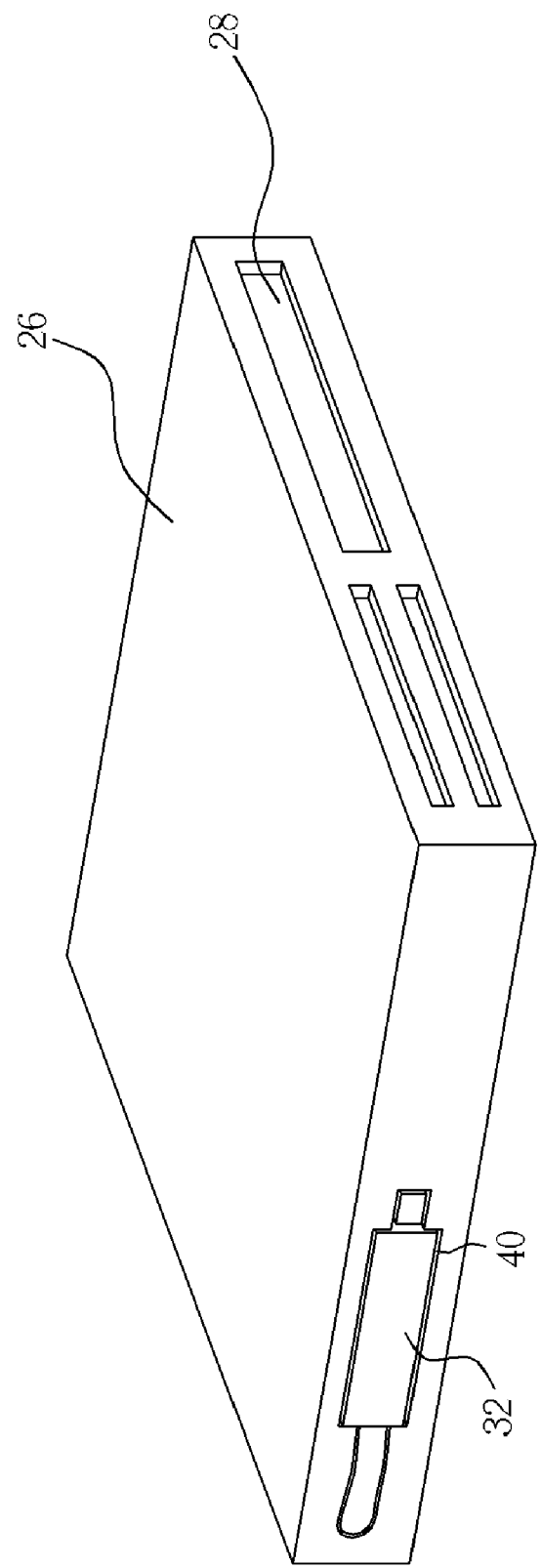
FIG. 7 illustrates another exemplary embodiment of the present invention portable device.

Please refer to FIG. 6 and FIG. 7. FIG. 6 illustrates an exemplary embodiment of the present invention portable device 20 in which the transmission line 32 along with the card reader 26 are not in use and contained in the storage box 21 (the cover 22 is not shown). As FIG. 6 shows, a space exists between one side of the card reader 26 and one side of the storage box 21 for holding the transmission line 32 when not in use. FIG. 7 illustrates another exemplary embodiment of the present invention portable device 20. The card reader 26 comprises a cavity 40 on one side for holding the transmission line 32 when not in use. Compared with the previous exemplary embodiment in FIG. 6, the exemplary embodiment in FIG. 7 saves more space inside the storage box 21.

Figure 8:
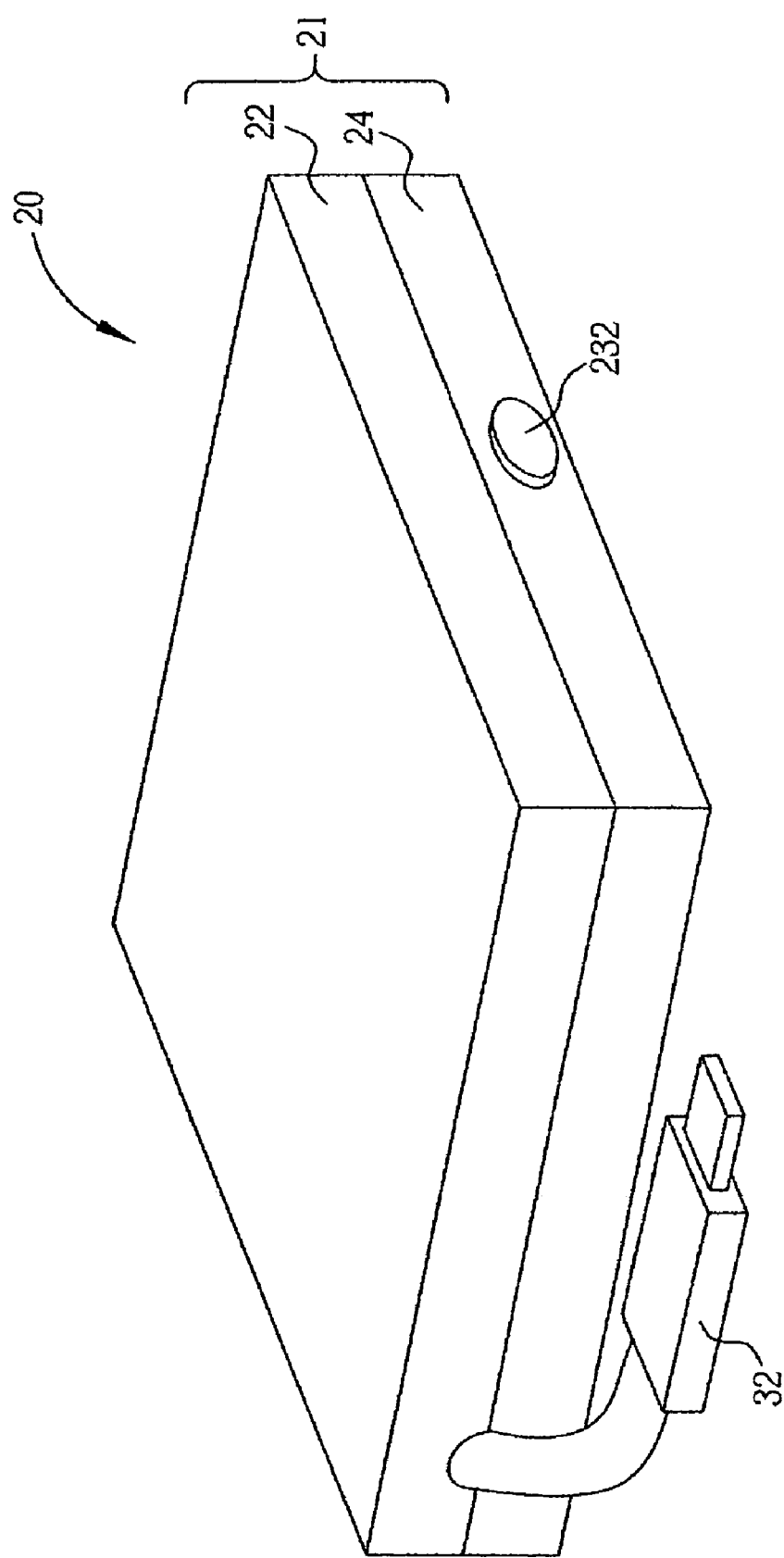
FIG. 8 illustrates the present invention portable device that is in use when the cover and the base of the storage box are closed.
Figure 9:
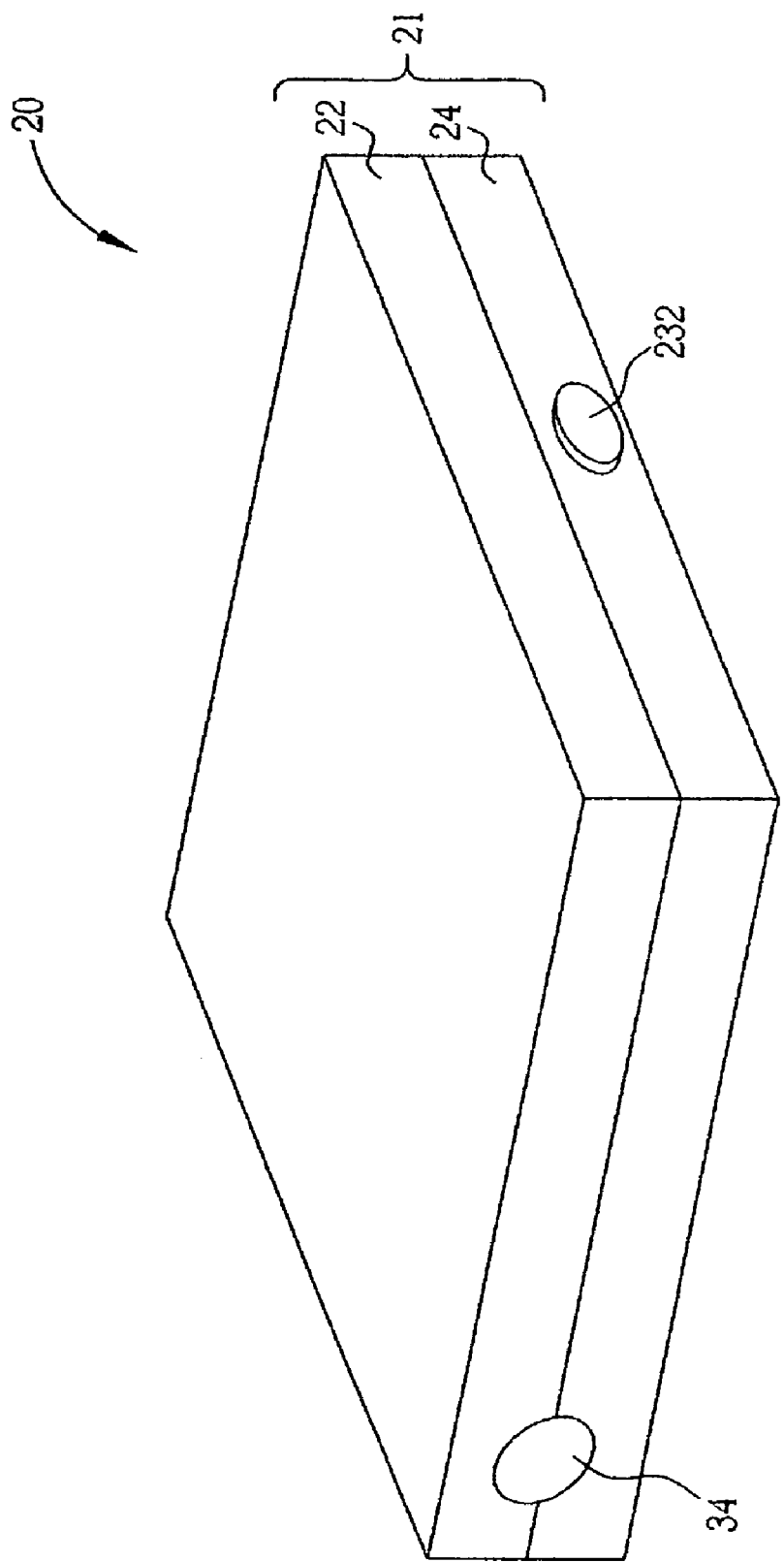
FIG. 9 illustrates the present invention portable device that is not in use when the cover and the base of the storage box are closed.

Compared with the prior art, the present invention card reader device has better dust and damage preventing and safety functions by fully containing a card reader in a storage box. Please further refer to FIG. 8 and FIG. 9. FIG. 8 illustrates the present invention portable device 20 in use with the cover 22 and the base 24 of the storage box 21 closed, wherein the card reader 26 and the memory card 27 are fully enveloped in the storage box 21 and are not shown in the figure. The transmission line 32 in use is exposed outside the storage box 21. FIG. 9 illustrates the present invention portable device 20 not in use when the cover 22 and the base 24 of the storage box 21 are closed, wherein the card reader 26 and the memory card 27 are fully enveloped in the storage box 21 and are not shown in the figure. The transmission line 32 not in use is also enveloped in the storage box 21 and is not shown in the figure. The present invention portable device 20 is capable of being closed at any time regardless of whether the card reader 26 within is in use or not, adding to the convenience, safety, and appearance of the invention.

Figure 10:
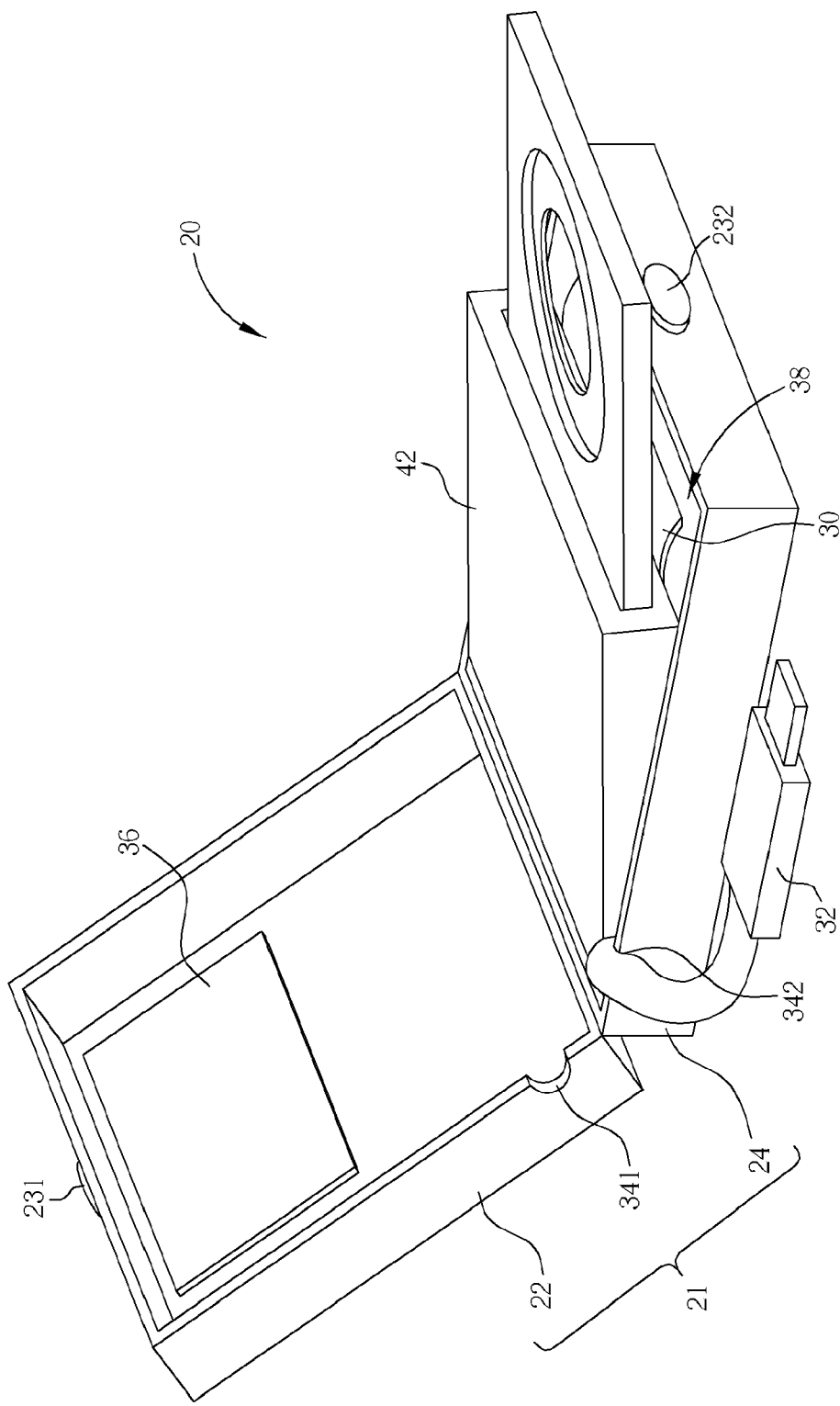
FIG. 10 illustrates another exemplary embodiment of the present invention portable device.

The present invention portable device is capable of storing and protecting not just a card reader, a portable hard disk or a portable CD-ROM is also capable of being applied to the present invention portable device, which provides these computer peripherals with more convenience and safety than the prior art applications. Please refer to FIG. 10 and FIG. 11. FIG. 10 illustrates another exemplary embodiment of the present invention portable device 20. Different from the exemplary embodiment in FIG. 2, the card reader 26 is replaced by a CD-ROM 42. As the cover 22 is separated from the base 24 of the storage box 21, the front end of the CD-ROM 42 is raised due to the pushing action of the elastic body 30 so that the disk tray of the CD-ROM 42 is free to open. After disk tray is drawn back into the CD-ROM 42, the storage box 21 can be closed so that the cover 22 presses down on the CD-ROM 42 along with the elastic body 30 until the hook 231 of the cover 22 is locked to the fastener 232 of the base 24.

Figure 11:
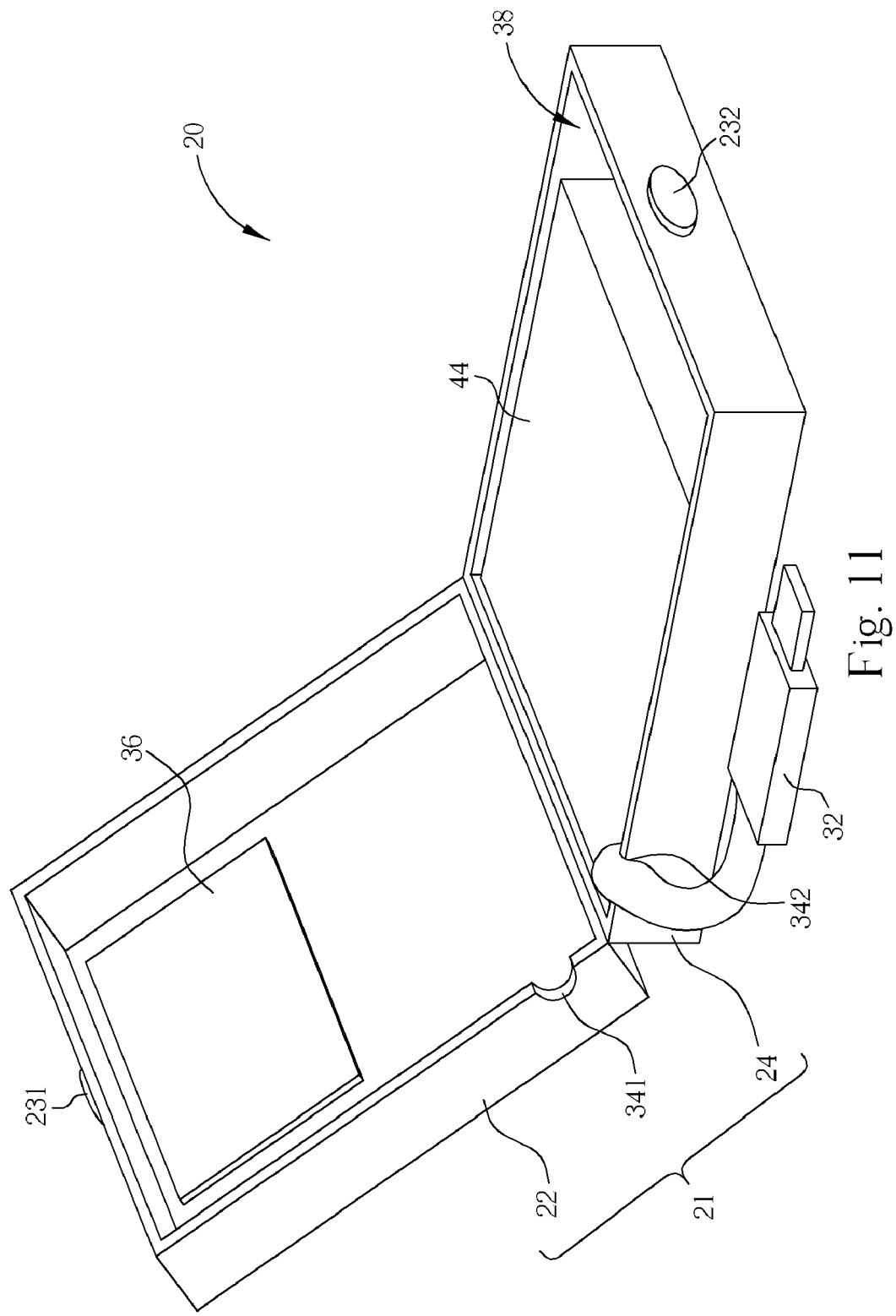
FIG. 11 illustrates another exemplary embodiment of the present invention portable device.

FIG. 11 illustrates another exemplary embodiment of the present invention portable device 20. Different from the exemplary embodiment in FIG. 2, the card reader 26 is replaced by a hard disk 44. The cover 22 is opened from the base 24 of the storage box 21 only when the hard disk 44 needs to be replaced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A portable device having a storage box for containing a data access device, the portable device comprising:
   a data access device for accessing data, the data access device comprising a socket on a front end for a memory card to plug into;
   a storage box for containing the data access device, the storage box comprising a cover and a base wherein when the cover of the box is closed an opening exists allowing a transmission line connected to the data access device; and further comprising an elastic body with one end connected to the data access device and the other end connected to the base of the storage box, the elastic body for elastically lifting the data access device from the base of the storage box when a front end of the cover of the storage box is separated from a front end of the base of the storage box to stretch out of the box;
   wherein a distance between a front end of the storage box and the front end of the data access device is longer than a length of an exposed part of the memory card when the memory card is plugged into the socket of the data access device.

2. The portable device of claim 1 further comprising a card-holding slot disposed inside the cover of the storage box.

3. The portable device of claim 1, wherein the elastic body is a spring.

4. The portable device of claim 1 further comprising a mirror disposed inside the cover of the storage box.

5. The portable device of claim 1 further comprising a transmission line for transmitting data, the transmission line removably connected to the data access device.

6. The portable device of claim 5, wherein the transmission line is a universal serial bus (USB) transmission line, a serial advanced technology attachment (Serial ATA) transmission line, or a Firewire transmission line.

7. The portable device of claim 5, wherein a space exists between one side of the data access device and one side of the storage box for the transmission line.

8. The portable device of claim 5, wherein the data access device further comprises a cavity for holding the transmission line.

9. The portable device of claim 1, wherein a back end of the cover of the storage box is rotatably connected to a back end of the base of the storage box.

10. The portable device of claim 1, wherein the opening is formed by a notch in the cover of the storage box and a corresponding notch in the base of the storage box.

11. The portable device of claim 1, wherein the opening is formed on the cover of the storage box.

12. The portable device of claim 1, wherein the opening is formed on the base of the storage box.

13. The portable device of claim 1, wherein the data access device is removably connected to the base of the storage box.

* * * * *